United States Patent [19]

Beyers, Jr.

[11] 4,450,587

[45] May 22, 1984

[54] TUNING ARRANGEMENT FOR PROVIDING RELATIVELY UNIFORM AUTOMATIC FINE TUNING SENSITIVITY

[75] Inventor: Billy W. Beyers, Jr., Greenfield, Ind.

[73] Assignee: RCA Corporation, New York, N.Y.

[21] Appl. No.: 325,313

[22] Filed: Nov. 27, 1981

[51] Int. Cl.³ ............................................. H04B 1/26
[52] U.S. Cl. .................................... 455/182; 455/192
[58] Field of Search ...................... 455/182, 183, 192; 358/195.1

[56] References Cited

U.S. PATENT DOCUMENTS

| | | |
|---|---|---|
| 2,872,579 | 2/1959 | Kihn . |
| 3,631,347 | 12/1971 | Chipman . |
| 3,814,843 | 6/1974 | Kruszewski . |
| 4,122,493 | 10/1978 | Arumugham et al. ........... 358/195.1 |
| 4,125,863 | 11/1978 | Arumugham .................... 358/195.1 |
| 4,142,157 | 2/1979 | Tanaka . |
| 4,245,351 | 1/1981 | Tults ..................................... 455/182 |
| 4,262,364 | 4/1981 | Fujita ................................... 455/192 |

FOREIGN PATENT DOCUMENTS 56-46325  4/1981  Japan .................................. 455/192

OTHER PUBLICATIONS

"Digitales Programmspeicher-System" by Friedrich Timmermann, Funkschau 1977, Heft 17, (with partial translation).

Primary Examiner—Marc E. Bookbinder
Attorney, Agent, or Firm—E. M. Whitacre; P. J. Rasmussen; P. M. Emanuel

[57] ABSTRACT

A tuning control system includes a pulse converter for converting a digital word to a corresponding pulse signal having pulses the width or frequency of which represents the magnitude of a tuning voltage associated with a respective channel. The pulse signal is applied to a filter which produces the tuning voltage. An automatic fine tuning (AFT) voltage is generated by an AFT discriminator in an IF section and also applied to the filter to modify the magnitude of the tuning voltage to correct for any frequency deviation of the IF signal. To make the response of the tuner to changes of the AFT voltage more uniform for different channels, the AFT voltage is applied to the filter through a switch which is selectively closed in response to the pulses of the pulse signal so as to change the effective amplitude of the AFT voltage applied to the filter as a function of the channel selected.

6 Claims, 4 Drawing Figures

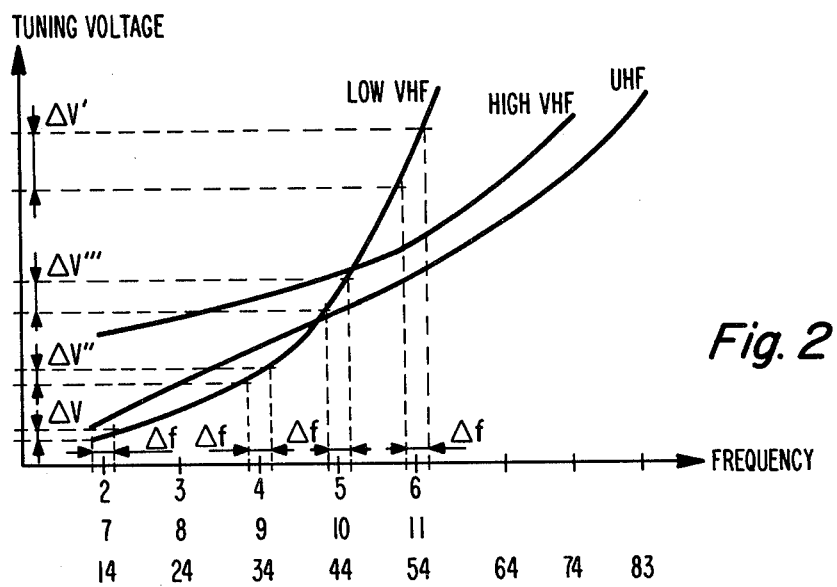
*Fig. 2*
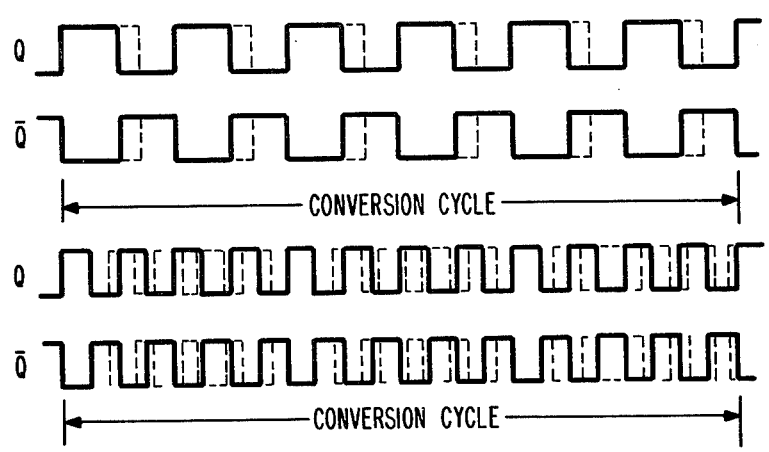
*Fig. 3*
*Fig. 4*

TUNING ARRANGEMENT FOR PROVIDING RELATIVELY UNIFORM AUTOMATIC FINE TUNING SENSITIVITY

The present arrangement concerns a voltage controlled tuner which is responsive to an automatic fine tuning (AFT) which has provisions for making the tuning sensitivity of the tuner to changes in the AFT voltage more uniform over a given range of frequencies.

Voltage controlled tuners typically include diodes, commonly referred to as "varactor" diodes, which are reverse biased by a tuning voltage to exhibit a capacitance which is directly related to the magnitude of the tuning voltage. The varactor diodes are connected with inductors in tuned circuits. The magnitude of the tuning voltage is varied to select the frequency to which the tuned circuits are tuned and thereby the modulated RF carrier which is heterodyned by the tuner to produce an IF signal.

A tuning voltage may be generated in response to the selection of a channel by a variety of apparatus which may generally be characterized as either frequency synthesizers or voltage synthesizers. A commonly employed frequency synthesizer includes a phase locked loop. An often employed voltage synthesizer includes a memory, including a plurality of memory locations, each of which corresponds to a respective channel and stores a digital word representing the respective tuning voltage magnitude. When a memory location is addressed, its contents are converted to a pulse signal which by the frequency or width of its pulses represents the magnitude of the tuning voltage. The pulse signal is filtered to produce the tuning voltage.

The IF signal includes an information bearing carrier, e.g., the picture carrier produced by a television tuner, which has a nominal frequency, e.g., 45.75 MHz in the United States, when the tuner has correctly tuned the receiver to a selected channel. The frequency of the information bearing carrier may not be at the nominal value for a variety of reasons. E.g., components in the tuner may change in value due to age and operating temperature variations, or as is sometimes the case in cable distribution systems, the RF carriers received by the tuner may not have correct or standard frequencies. Accordingly, receivers typically include an automatic fine tuning (AFT) circuit including a frequency discriminator tuned to the nominal frequency of the information bearing carrier to derive an AFT voltage which by its magnitude and polarity represents the deviation of the frequency of the information bearing carrier from its nominal frequency. The AFT voltage and the basic tuning voltage produced by the tuning control apparatus are applied to the tuner to control its frequency selection.

Tuned circuits employing varactor diodes exhibit a non-linear frequency versus control voltage characteristic. Specifically, they require larger voltage changes to correct a given frequency deviation at high frequency channels than at low frequency channels. Accordingly, the tuner exhibits more frequency sensitivity to changes of the AFT voltage at low frequency channels than at high frequency channels.

The non-uniformity makes it more difficult to automatically fine tune high frequency channels than low frequency channels. Moreover, the non-linearity of the frequency versus control voltage characteristic also affects the stability of the closed loop comprising the tuner and AFT circuitry. Specifically, since the sensitivity is indicative of gain, the loop gain is also non-uniform. Accordingly, component tolerances must be tightly controlled to ensure stability over a relatively wide range of gain. The present invention concerns apparatus for making the sensitivity or gain more uniform.

In a channel selection system constructed in accordance with the present invention, coupling means for coupling an AFT voltage to tuning voltage generating means for generating a tuning voltage includes switch means for selectively applying the AFT voltage to the tuning voltage generating means in response to pulses of a pulse signal. Pulse generating means generates the pulse signal and controls at least one of the frequency or width of the pulses in response to the channel selected.

In a preferred embodiment of the present invention, the tuning voltage generator includes pulse converter means for converting a digital word read from a memory location corresponding to the selected channel to a pulse signal which is filtered to produce the tuning voltage and the pulse converter means advantageously also serves as the pulse generator means which controls the switch means.

The details of the preferred embodiment will be described with reference to the accompanying drawing in which:

FIG. 2 is a graphical representation of tuning voltage versus frequency characteristic of a voltage controlled tuner useful in facilitating an understanding of the present invention; and FIGS. 3 and 4 are graphical representations of pulse signals generated in the preferred embodiment shown in FIG. 1 and useful in facilitating the understanding of the preferred embodiment.

Figure 1:
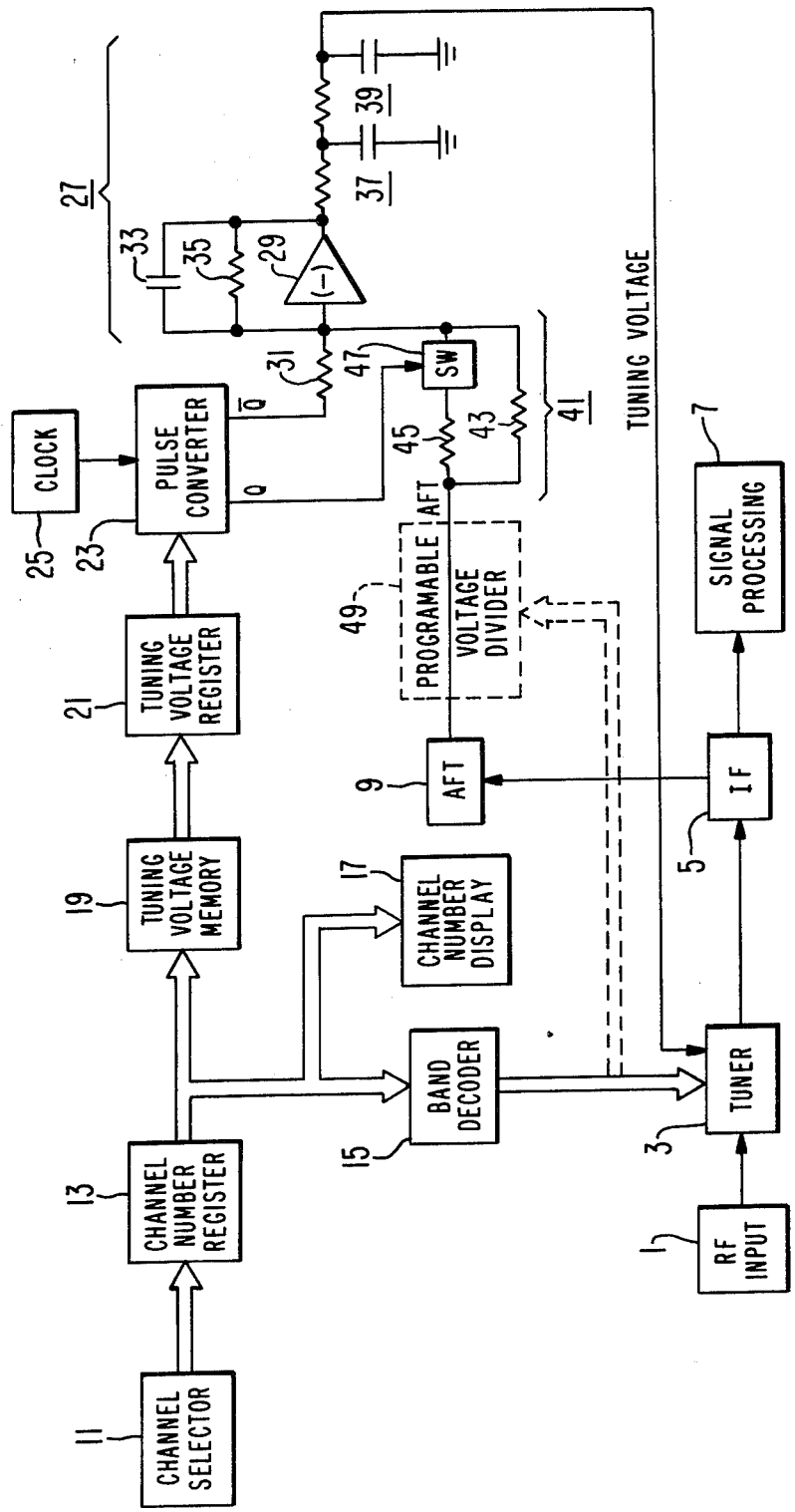
FIG. 1 shows, partially in block diagram form and partially in schematic diagram form, a channel selection system incorporating the preferred embodiment of the present invention.

In FIG. 1, a television receiver includes an RF input 1, voltage controlled tuner 3, IF processing circuit 5 and signal processing section 7 arranged in conventional fashion to produce picture and audio responses. Tuner 3 selects and heterodynes one of the RF carriers modulated with television information received from RF input 1 in response to the magnitude of a tuning voltage and band selection signals generated in accordance with the selected channel, as will be described below, to produce an IF signal. The IF signal includes modulated picture and sound carriers which are demodulated by signal processing section 7 to produce the picture and audio responses.

When a selected RF carrier is properly tuned, the IF frequency of the picture carrier has a nominal value, e.g., in the United States 45.75 MHz. Since the magnitude of the tuning voltage and the components of tuner 3 may change with age and environmental conditions and the frequency of RF carriers such as provided by cable distribution systems may not have standard values, a conventional automatic fine tuning (AFT) circuit 9 including a frequency discriminator tuned to the nominal frequency of the IF picture carrier is utilized to produce an AFT voltage which has magnitude and polarity representing the magnitude and sense of deviation of the frequency of the IF picture carrier from its nominal value. As will be described below, AFT voltage is used to modify the magnitude tuning to correct for frequency deviations of the picture carrier.

Voltage controlled tuner 3 includes a separate tuning section for RF carriers corresponding to channels 2 through 13 in the VHF range extending approximately between 54 and 216 MHz and for RF carriers corresponding to channels 14 through 83 in the UHF range extending approximately between 470 and 890 MHz. Depending on the band of the selected channel, a band selection signal activates the appropriate one of the VHF or UHF tuning sections. Each tuning section includes a voltage tunable RF amplifier, a voltage tunable local oscillator and a mixer for mixing the output signals of the RF amplifier and local oscillator to produce the IF signal. The voltage tunable circuits comprise an inductor and a varactor diode reverse biased by the tuning voltage to exhibit a capacitance directly related to the magnitude of the tuning voltage. The frequency to which the tuned circuit is tuned is thus dependent on the magnitude of the tuning voltage. Since it has been found that the tuned circuits in the VHF tuning section cannot readily be tuned throughout the entire VHF range with a fixed varactor diode and inductor configuration, the inductor configuration in the tuning circuits for the VHF channels is changed at a predetermined frequency in the VHF range. Specifically, a different inductor configuration is selected for low band VHF channels 2 through 6 than for high band VHF channels 7 through 13. The tuning voltage versus frequency (in terms of channel numbers) for the low and high VHF bands and the UHF range is shown in FIG. 2.

Channels are selected by means of a channel selector 11 which may, e.g., comprise a calculator like keyboard by which the two digits of the respective channel number are entered in the form of two four bit (binary digit) digital words each in BCD (binary coded decimal) format. The resulting eight bit word representing the channel number of the selected channel is stored in a register 13. The contents of channel numbers register 13 are supplied to a band decoder 15 which generates the band selection signals in accordance with the channel number and a channel number display 17 which produces a two digit display of the channel number, e.g., by means of two seven segment light emitting diode arrays.

The contents of channel number register 13 are also applied to a memory 19. Memory 19 includes a plurality of memory locations corresponding to respective channels. Each memory location contains a digital word of, e.g., twelve bits, representing in straight binary format the tuning voltage magnitude for the corresponding channel. In response to the contents of channel number register 13, the memory location corresponding to the selected channel number is addressed and its contents, representing the tuning voltage of the selected channel, are loaded into a register 21.

A pulse converter 23 receives the digital word stored in tuning voltage register 21 and a clock signal from clock oscillator 25. Pulse converter 23 produces a pulse signal Q having pulses the width of which corresponds to the magnitude represented by the digital word stored in tuning voltage register 21. Pulse converter 32 also produces, e.g., by means of a logic invert, the complement $\overline{Q}$ of the Q pulse signal. Graphical representation of Q and $\overline{Q}$ are shown in FIG. 3. A pulse converter for converting a digital word stored in a tuning voltage memory location to a pulse signal having pulses the width of which is proportional to the tuning voltage magnitude for the corresponding channel suitable for use as pulse converter 23 is described in detail in now allowed U.S. patent application Ser. No. 098,925, entitled "Digital to Analog Converter Useful In A Television Tuning System", filed on Nov. 30, 1979 in the names of S. A. Steckler and A. R. Balaban and assigned to the same assignee as the present application which is incorporated by reference, now issued as U.S. Pat. No. 4,364,094.

A low pass filter 27 generates the tuning voltage in response to its average voltage of pulse signal $\overline{Q}$. Low pass filter 27 includes an operational amplifier 29 having an inverting input (−) to which the $\overline{Q}$ pulse signal is coupled through a resistor 31. A negative feedback network including the parallel combination of a capacitor 33 and a resistor 35 is coupled between the output and input of amplifier 29 to provide a low pass filter response. Two cascaded resistor-capacitor networks 37 and 39 additionally low pass filter the signal developed at the output of amplifier 29 to produce the tuning voltage.

It will be noted that while the tuning voltage is directly proportional to the average value of the Q pulse signal, the tuning voltage is directly proportional to one less the average value of the $\overline{Q}$ pulse signal. Accordingly, although the $\overline{Q}$ pulse signal is filtered rather than the Q pulse signal, by applying the $\overline{Q}$ pulse signal to the inverting input (−) of operational amplifier 29 so that a signal inversion takes place, the average value of the Q pulse signal is produced.

The AFT voltage produced by AFT circuit 9 is also applied to the inverting input (−) of amplifier 29 through a coupling path 41 so that the magnitude of the tuning voltage is affected by the sense and magnitude of the AFT voltage. Because of the signal inversion produced by amplifier 29, the polarity of the AFT voltage produced by AFT circuit 9 is selected so that positive sense frequency deviations reduce the magnitude of the tuning voltage and negative sense frequency deviations increase the magnitude of the tuning voltage.

As discussed above, the control voltage versus frequency characteristics of a tunable circuit including a varactor diode is non-linear as exhibited in FIG. 2. Specifically, with reference, e.g., to the low VHF characteristic, it takes a greater change of the AFT voltage ($\Delta V$ and $\Delta V'$) at high frequency channels such as channel 6 to correct for a frequency deviation ($\Delta f$) of the IF picture carrier than at low frequency channels such as channel 2. Expressed in terms of gain, the gain between the output of AFT circuit 9 and the IF output of tuner 3 is less at high frequency channels than at low frequency channels. This makes it difficult to ensure stability of the AFT control loop over an entire band without the maintenance of tight component tolerances. However, in the present apparatus the latter requirement is considerably eased by circuitry within coupling path 41 which makes the sensitivity or gain of the AFT control arrangement more uniform.

Specifically, coupling network 41 includes the parallel combination of a first resistor 43 with the series combination of a resistor 45 and electronic switch 47 coupled between the AFT output of AFT circuit 9 and the inverting input (−) of amplifier 29. The ratio of the impedance of the feedback network comprising capacitor 33 and resistor 35 to the impedance of coupling network 41 determines gain between the output of AFT circuit 9 and the output of amplifier 29 and therefore the amplification of the AFT component of the tuning voltage. Assuming that switch 47 is opened so that no current flows through resistor 45, the amplification of the AFT component is determined by the impedance of the feedback network to the resistance of resistor 43. The resistance of resistor 43 is selected to set the appropriate amplification of the AFT component at the lowest frequency channel in a given band, e.g., channel 2 in the low VHF band.

Electronic switch 47 is closed in response to the positive-going pulses of pulse signal Q. This causes resistor 41 and 43 to be connected in parallel combination thereby decreasing the effective resistance of coupling path 41 and increasing the amplification of the AFT voltage. Since the pulse width of the positive-going pulses increases with the frequency of the selected channel, at the highest frequency channel in the band, e.g., channel 6 in the low VHF band, switch 47 is closed for longer durations of time at the highest frequency channel than at the lowest frequency channel. Accordingly, the amplification of the AFT voltage is greater at the highest frequency channel than the lowest frequency channel. The specific resistance of resistor 45 is selected to provide the magnitude of the AFT component of the tuning voltage required at the highest frequency channel in a band to correct a given frequency deviation at least approximately equally at the highest and lowest frequency channels in the band.

It will be noted that as the frequency increases, at channels between the lowest and highest frequency channels, e.g., with reference to the low VHF band, the magnitudes of the AFT voltage changes required to correct the same frequency deviation $\Delta f$ (e.g., see $\Delta V''$ for channel 4 and $\Delta V'''$ for channel 5) generally tends to increase. As the frequency of the selected channel increases, since the width of the pulses of the Q pulse signal and thereby the time durations switch 47 is closed to connect resistors 43 and 45 in parallel also increases, as explained above, the amplification of the AFT component of the tuning voltage also increases. As a result, as the frequency of the selected channel increases, the decreasing sensitivity of tuner 3 to changes of the AFT component tends to be compensated for by the increasing magnitude of the AFT component of the tuning voltage throughout the band.

While three bands have three different characteristics, as is seen in FIG. 2, it is believed that coupling network 41 is sufficient to compensate for the nonlinearities in each band for acceptable performance. However, it will be appreciated that three separate coupling networks, each similar to coupling network 41, which are individually coupled between the output of AFT circuit 9 and the input of amplifier 29 and activated in response to respective band selection voltages may be employed if desired.

Furthermore, it will be noticed from FIG. 2 that the control voltage versus frequency characteristics for the low VHF, high VHF and UHF bands have successively lesser average or general slopes. Since the general slope of a characteristic is inversely related to the general gain between the output of AFT circuit 9 and the IF output of tuner 3 in terms of the required change in AFT voltage to produce a given change in IF picture carrier frequency, it is seen that the general gains for the low VHF, high VHF and UHF bands are successively greater. To compensate for this it may be desirable to insert a programmable voltage divider 49 between the output of AFT circuit 9 and coupling network 41 to successively attenuate the AFT voltage in response to the band selection signals representing the low VHF, high VHF and UHF bands, respectively. Such a programmable voltage divider may simply include a resistive voltage divider comprising first and second resistor connected in series between the output of AFT circuit and signal ground with the point between the resistors coupled to coupling network 41 and third and fourth resistors selectively connected in parallel combination with the second resistor by respective electronic switches when enabled by the band selection signals for the high VHF band and UHF band, respectively.

While pulse converter 23 has been described in terms of a pulse width modulator by which a constant frequency pulse signal having pulses the width of which is directly related to the magnitude of the tuning voltage is produced as shown in FIG. 3, it may also comprise a binary rate multiplier. As is known and shown in FIG. 4, a binary rate multiplier produces a constant pulse width pulse signal in which the frequency of the pulses is directly related to the magnitude of the tuning voltage. It is noted that the average value of the pulse signal produced by such a binary rate multiplier over a given conversion cycle for a given digital word will be the same as the average value of the pulse signal produced by a pulse width modulation over the same conversion cycle and digital word. Accordingly, switch 47 of coupling network 41 will be closed and open for the same total time duration in response to either type of pulse signal.

The above described modifications as well as others are contemplated to be within the scope of the present invention defined by the following claims.

I claim:

1. In a receiver including a channel selector for selecting a channel from a plurality of channels, a tuner responsive to the magnitude of a tuning voltage for selecting and heterodyning the RF signal corresponding to the selected channel to produce an IF signal including an information bearing carrier, and an automatic fine tuning (AFT) circuit responsive to said IF signal for producintg a continuous AFT voltage which by its polarity and magnitude represents the sense and magnitude of a deviation between the frequency of said information bearing carrier and a nominal value, apparatus comprising:

register means coupled to said channel selector for storing a digital word representing the magnitude of the tuning voltage corresponding to the selected channel;

pulse converter means for converting said digital word to a pulse signal having pulses the duration which is related to the magnitude of said tuning voltage for the selected channel;

filter means responsive to said pulse signal and said AFT voltage for producing said tuning voltage in accordance with the average value of said pulse signal as modified by the amplitude of said AFT voltage;

switchable impedance means included within said filter means for controlling a gain factor of said filter means and selectively having one of first and second different impedance values which define respective different effective amplitudes of said AFT voltage by which said tuning voltage is modified by said AFT voltage; and switchable impedance control means coupled to said switchable impedance means and responsive to said pulse signal for causing said switchable impedance to have said first impedance value during the entire duration of each of said pulses of said pulse signal and said second impedance value during the entire duration of each interval between adjacent ones of said pulses of said pulse signal.

2. The apparatus recited in claim 1 wherein:

said filter means includes amplifier means for amplifying said AFT voltage;

said switchable impedance means is included in said amplifier means for selectively setting the gain factor by which said AFT voltage is amplified.

3. The apparatus recited in claim 2 wherein:

said amplifier means also amplifies said pulse signal; and said amplifier means including an operational amplifier, a pulse input path for coupling said pulse signal to said operational amplifier, an AFT input signal path for coupling said AFT signal to said operational amplifier, an output coupled to a point at which said tuning voltage is developed, and a feedback path coupled between said output of said amplifier and at least one of said input paths;

said switchable impedance means being included in said AFT input path.

4. The apparatus recited in claim 3 wherein:

said switchable impedance means includes a first resistor coupled between said AFT circuit and an input of said operational amplifier, a second resistor and a switch connected in series with each other and in parallel with said first resistor; and said switchable impedance control means includes switch control means responsive to said pulse signal for rendering said switch non-conductive during the entire duration of each of said pulses of said pulse signal and for rendering said switch conductive during the entire duration of each interval between adjacent ones of said pulses of said pulse signal.

5. The apparatus recited in claim 4 wherein:

said pulse converter means generates first and second complementary pulse signals, said first pulse signal having pulses the duration of which is inversely related to the magnitude of said tuning voltage for the selected channel, said second pulse signal having pulses the width of which is directly related to the magnitude of said tuning voltage for the selected channel;

said operational amplifier having an inverting input, said feedback path being coupled between said output and said inverting input of said operational amplifier;

said pulse input path coupling said first pulse signal to said inverting input of said operational amplifier;

said AFT input path coupling said AFT voltage to said inverting input of said operational amplifier; and said switch control means includes a control input coupled to receive said second pulse signal, said switch being rendered conductive in response to the pulses of said second pulse signal.

6. The apparatus recited in claim 5 wherein:

said feedback path includes a reactive filter component.

* * * * *